(12) United States Patent
Kengeri

(10) Patent No.: US 6,452,834 B1
(45) Date of Patent: Sep. 17, 2002

(54) 2T DUAL-PORT DRAM IN A PURE LOGIC PROCESS WITH NON-DESTRUCTIVE READ CAPABILITY

(75) Inventor: Subramani Kengeri, San Jose, CA (US)

(73) Assignee: Silicon Access Networks, San Jose, CA (US)

(*) Notice: Subject to any disclaimer, the term of this patent is extended or adjusted under 35 U.S.C. 154(b) by 0 days.

(21) Appl. No.: 09/782,490

(22) Filed: Feb. 13, 2001

(51) Int. Cl.$^7$ ................................................. G11C 7/00
(52) U.S. Cl. ......................................... 365/174; 365/222
(58) Field of Search .................................. 365/174, 222

(56) References Cited

U.S. PATENT DOCUMENTS 6,072,713 A * 6/2000 McKenny et al. .......... 365/150
6,233,193 B1 * 5/2001 Holland et al. ............. 365/222
6,310,880 B1 * 10/2001 Waller ........................ 370/400

FOREIGN PATENT DOCUMENTS

JP   0007592   * 1/1988 ............ G11C/11/34

OTHER PUBLICATIONS

Betty Prince, "Semiconductor Memories", 1983, Wiley, 2$^{nd}$ pp. 155 and 156.*

* cited by examiner

Primary Examiner—M. Tran
(74) Attorney, Agent, or Firm—Fernandez & Associates, LLP

(57) ABSTRACT

A 2T dual-port dynamic random access memory (DRAM) that can be fabricated using a pure logic process. Write/Refresh port is independent for any DRAM cell of the DRAM. Sense amplifier is built into each DRAM cell.

26 Claims, 3 Drawing Sheets

2T DUAL-PORT DRAM IN A PURE LOGIC PROCESS WITH NON-DESTRUCTIVE READ CAPABILITY

FIELD OF THE INVENTION

The invention relates to computer memory, particularly to dynamic random access memory (DRAM).

BACKGROUND

A conventional DRAM cell requires expensive process steps to develop a capacitor. Moreover, a conventional dual-port DRAM requires major process changes to optimize the capacitor processing. Furthermore, compared to computer memory such as static random access memory (SRAM), the conventional DRAM is slower in speed due to the generation of charge sharing read differential.

BRIEF DESCRIPTION OF THE FIGURES

The accompanying drawings which are incorporated in and form a part of this specification, illustrate embodiments of the invention and together with the description, serve to explain the principles of the invention.

DETAILED DESCRIPTION

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
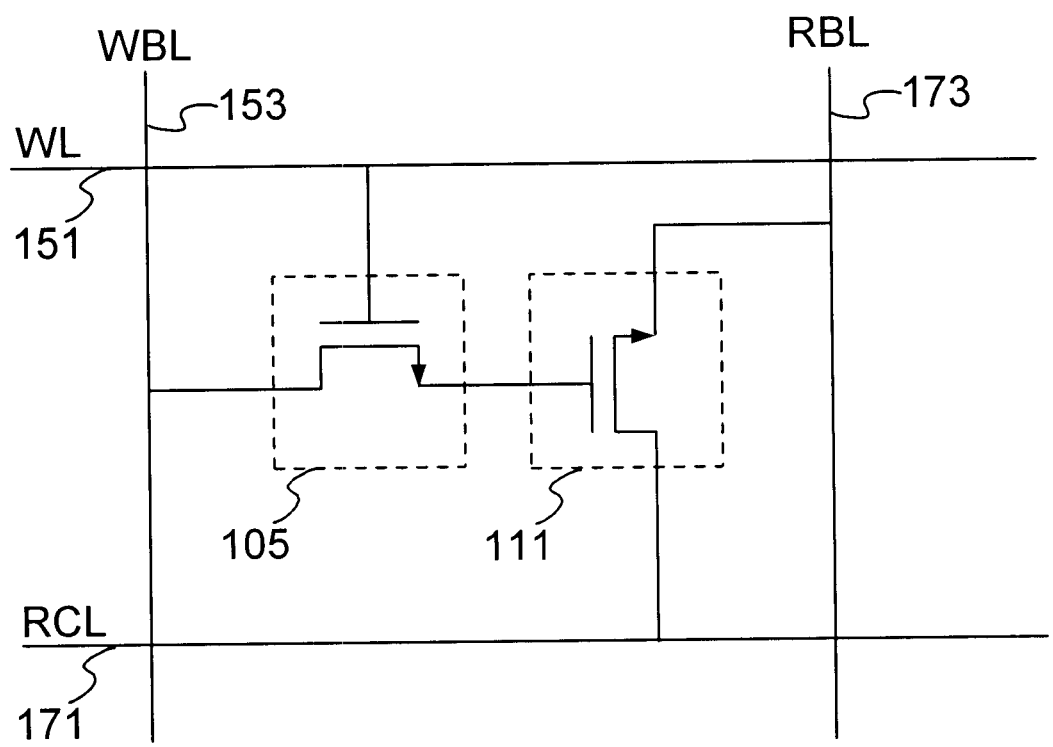
FIG. 1 shows a nMOS DRAM cell in accordance with one embodiment of the invention.

Referring now to FIG. 1, a DRAM cell 100 implementing nMOS transistors is shown in accordance with one embodiment of the invention. As shown, DRAM cell 100 comprises an access transistor 105 implemented as nMOS, a read-amplifying (RA) transistor 111 implemented as nMOS, a write line (WL) 151, a write bit line (WBL) 153, a read control line (RCL) 171, and a read bit line (RBL) 173.

Access transistor 105 is coupled to RA transistor 111. Specifically, the source of access transistor 105 is coupled to the gate of RA transistor 111. The gate of access transistor 105 is coupled to WL 151; the drain of access transistor 105 is coupled to WBL 153. The drain of RA transistor 111 is coupled to RCL 171; the source of RA transistor 111 is coupled to RBL 173.

Continuing with FIG. 1, RA transistor 111 is adapted to store data such as a logic 1 (High) or a logic 0 (Low). Specifically, rather than using a capacitor to store the charge, the gate of RA transistor 111 is used to store the charge. As such, in contrast to a conventional DRAM cell, no capacitor is used in the present embodiment. Accordingly, steps for fabricating a capacitor inside DRAM cell 100 can be avoided. Thus, DRAM cell 100 can be fabricated using a pure logic process. Moreover, as will be described below, RA transistor 111 amplifies the read of a logic 1 from DRAM cell 100. Thus, transistor 111 can operate as a built-in data sense amplifier for DRAM cell 100.

As understood herein, in other embodiments of the invention, a logic 1 can be used to represent High, and a logic 0 can be used to represent Low.

Writing a '0':

Referring still to FIG. 1, to write a logic 0 to DRAM cell 100, WBL 153 is driven low to indicate a logic 0 on WBL 153. WL 151 is driven high to activate the gate of access transistor 105, thereby allowing current to flow between the drain and the source of access transistor 105. As such, whatever charges presented at the gate of RA transistor 111 is allowed to discharge through access transistor 105 and dissipate through WBL 153 that has been driven low. Then, WL 151 is driven low to deactivate access transistor 110, thereby cutting off access to the gate of RA transistor 111. As such, voltage at the gate of RA transistor 111 remains low to represent a logic 0. Consequently, a logic 0 is stored at (written to) DRAM cell 100.

Writing a '1':

Referring still to FIG. 1, to write a logic 1 to DRAM cell 100, WBL 153 is driven high to indicate a logic 1 on WBL 153. WL 151 is driven high to activate the gate of access transistor 105, thereby allowing current to flow between the drain and the source of access transistor 105. As such, the logic 1 on WBL 153 is allowed to pass through access transistor 105 and reach the gate of RA transistor 111, thereby charging the gate of RA transistor 111. Then, WL 151 is driven low to deactivate access transistor 110, thereby cutting off access to the gate of RA transistor 111. As such, charges on the gate of RA transistor 111 is prevented from discharging via access transistor 110. And as such, charges are stored at (written to) the gate of RA transistor 111 to represent the logic 1. Consequently, the logic 1 is stored at (written to) DRAM cell 100.

Refresh:

To refresh a logic 1 at DRAM cell 100, WBL 153 is driven high to indicate a logic 1 on WBL 153. WL 151 is driven high to activate the gate of access transistor 105, thereby allowing current to flow between the drain and the source of access transistor 105. As such, the logic 1 is allowed to pass through access transistor 105 and reach the gate of RA transistor 111. As such, voltage at the gate of RA transistor 111 is replenished. Then, WL 151 is driven low to deactivate access transistor 110, thereby cutting off access to the gate of RA transistor 111. As such, charges at the gate of RA transistor 111 are prevented from leaking out of access transistor 110. Consequently, a logic 1 is refreshed at DRAM cell 100.

Reading operations:

Continuing with FIG. 1, to read data stored at DRAM cell 100, RCL 171 is driven high. The stored data is read out through RBL 173, wherein the voltage level of RBL 173 is used to indicate data stored in DRAM cell 100.

Reading a '0':

If a logic 0 is being stored at the gate of RA transistor 111, the gate of RA transistor 111 is deactivated, thereby preventing current from RCL 171 to reach and charge RBL 173. As such, the absence of a current on RBL 173 keeps RBL 173 low to indicate a logic 0. Consequently, a logic 0 is read out of DRAM cell 100 through RBL 173.

As understood herein, in a conventional DRAM cell, reading a logic 0 involves redistribution of charge between a pre-charged bit line and a discharged capacitor, then sensing the amplified voltage differential of the bit line. The charge redistribution destroys the data (charge) maintained on the capacitor. As such, the read access to the conventional DRAM cell is a destructive read.

In contrast, because the logic 0 at the gate of RA transistor 111 is maintained, reading a logic 0 is non-destructive. Specifically, because the present embodiment does not rely on charge distribution and sense amplification of voltage differential, the logic 0 being stored at the gate of RA transistor 111 is not destroyed by reading a logic 0. As such, in the present embodiment, reading a logic 0 is non-destructive. Also, because the read does not depend on the destructive charge sharing voltage differential, the read speed allowed by DRAM cell 100 is significantly higher than that of a conventional DRAM cell. Moreover, the present embodiment does not rely on charge redistribution that necessitates voltage differential sensing and sense amplification.

Reading a '1":

If a logic 1 is being stored at the gate of transistor 111, the gate of transistor 111 is activated, thereby allowing a current from RCL 171 to reach and charge RBL 173. Moreover, en route to RBL 173, the current from RCL 171 is amplified by RA transistor 111. As such, this current drives RBL 173 high to indicate a logic 1. Consequently, a logic 1 is read out of DRAM cell 100 through RBL 173. Moreover, because the logic 1 being stored at the gate of RA transistor 111 is maintained, reading a logic 1 is non-destructive. Also, when traveling through RA transistor 111, the current is amplified by the current-amplifying property of RA transistor 111 operating as a read amplifier for DRAM cell 100.

As understood herein, in a conventional DRAM cell, reading a logic 1 involves redistribution of charge between a pre-charged bit line and a discharged capacitor, then sensing the amplified voltage differential of the bit line. The charge redistribution destroys the data (charge) maintained on the capacitor. As such, the read access to the conventional DRAM cell is a destructive read.

In contrast, because the logic 1 at the gate of RA transistor 111 is maintained, reading a logic 1 is non-destructive. Specifically, because the present embodiment does not rely on charge distribution and sense amplification of voltage differential, the logic 1 at the gate of RA transistor 111 is not destroyed by reading a logic 1. As such, in the present embodiment, reading a logic 1 is non-destructive. Also, because the read does not depend on the destructive charge sharing voltage differential, the read speed allowed by DRAM cell 100 is significantly higher than that of a conventional DRAM cell.

Dual-Port Capability:

As shown in FIG. 1, DRAM cell 100 is a dual port DRAM cell because DRAM cell 100 has separate bit lines (WBL 153 and RBL 173) respectively as a writing/refresh port and a reading port. As such, write can be performed simultaneously into any other DRAM cell using the same bit line such as WBL 153. Refresh can be performed through WBL 153 because the write/refresh port is independent of the read port. Effectively in the same clock cycle, a write or a refresh can be performed to cell 100 while a read can be performed from another DRAM cell. Similarly, effectively in the same clock cycle, a write or a refresh can be performed to another DRAM cell while a read can be performed from DRAM cell 100. Moreover, unlike conventional dual-port DRAM cells, DRAM cell 100 can be fabricated in a very simple pure logic process.

Figure 2:
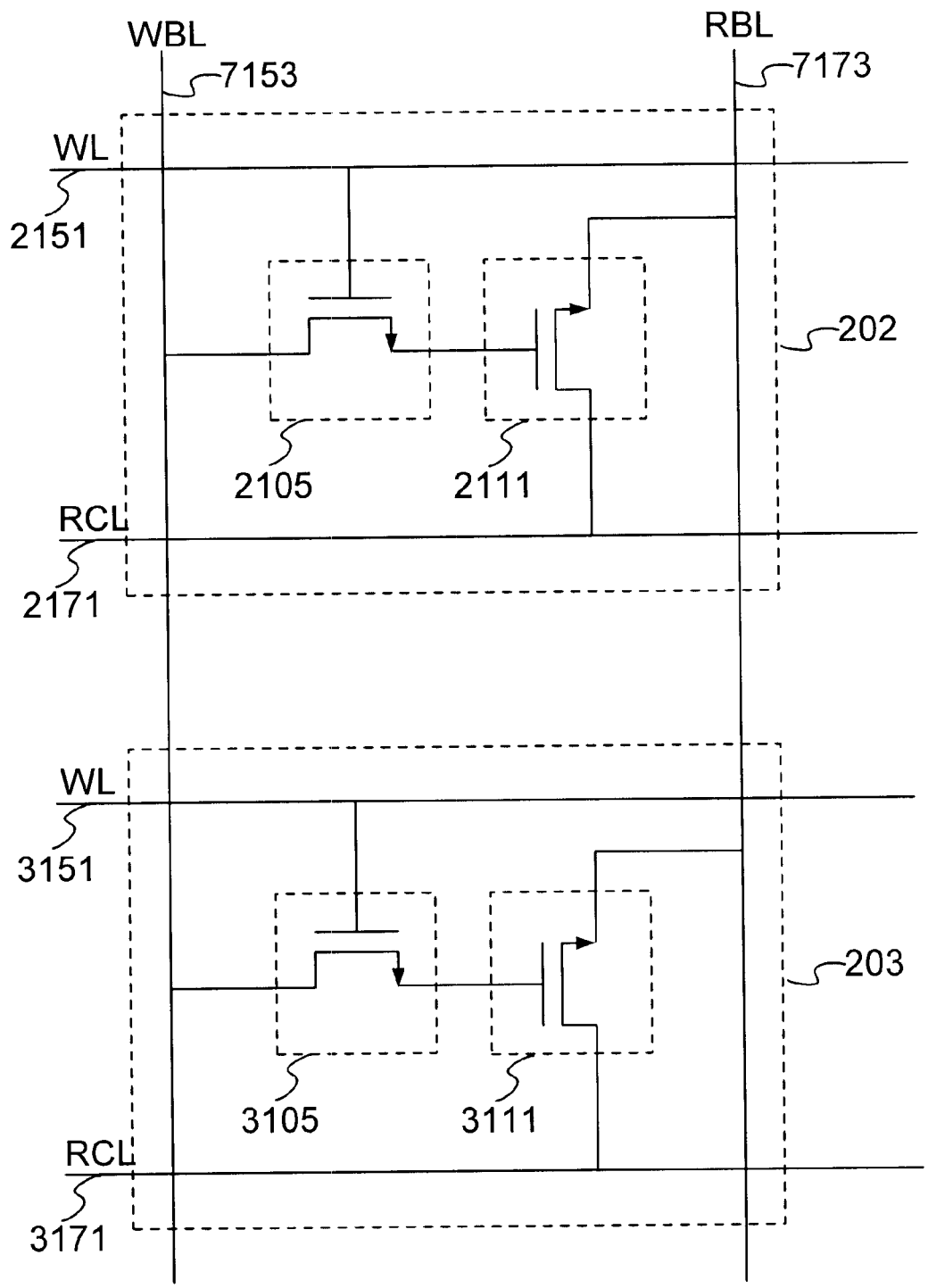
FIG. 2 shows a DRAM comprising two DRAM cells in accordance with one embodiment of the invention.

Referring now to FIG. 2, a DRAM 200 comprising two DRAM cells 202 and 203 is shown in accordance with one embodiment of the invention. As shown, DRAM cell 201 comprises an access transistor 2105, a RA transistor 2111, a WL 2151, a write bit line WBL 7153, a RCL 2171, and a RBL 7173. Also as shown, DRAM cell 203 comprises an access transistor 3105, a RA transistor 3111, a WL 3151, WBL 7153 (shared with cell 202), a RCL 3171, and RBL 7173 (shared with cell 202). Transistors 2105, 2111, 3105 and 3111 are implemented with nMOS transistors.

For cell 202, access transistor 2105 is coupled to RA transistor 2111. Specifically, the source of access transistor 2105 is coupled to the gate of RA transistor 2111. The gate of access transistor 2105 is coupled to WL 2151; the drain of access transistor 2105 is coupled to WBL 7153. The drain of RA transistor 2111 is coupled to RCL 2171; the source of RA transistor 2111 is coupled to RBL 7173.

For cell 203, access transistor 3105 is coupled to RA transistor 3111. Specifically, the source of access transistor 3105 is coupled to the gate of RA transistor 3111. The gate of access transistor 3105 is coupled to WL 3151; the drain of access transistor 3105 is coupled to WBL 7153. The drain of RA transistor 3111 is coupled to RCL 3171; the source of RA transistor 3111 is coupled to RBL 7173.

Continuing with FIG. 2, in cell 202, RA transistor 2111 is adapted to store data such as a logic 1 (High) or a logic 0 (Low). Specifically, rather than using a capacitor to store the charge, the gate of RA transistor 2111 is used to store the charge. As such, in contrast to a conventional DRAM cell, no capacitor is used in cell 202 of the present embodiment. Accordingly, steps for fabricating a capacitor inside DRAM cell 202 can be avoided. Thus, DRAM cell 202 can be fabricated using a pure logic process. Moreover, as will be described below, RA transistor 111 amplifies the read of a logic 1 from DRAM cell 202. Thus, transistor 2111 can operate as a built-in data sense amplifier for DRAM cell 202.

As understood herein, in other embodiments of the invention, a logic 1 can be used to represent High, and a logic 0 can be used to represent Low.

In cell 203, RA transistor 3111 is adapted to store data such as a logic 1 or a logic 0. Specifically, rather than using a capacitor to store the charge, the gate of RA transistor 3111 is used to store the charge. As such, in contrast to a conventional DRAM cell, no capacitor is used in cell 203 of the present embodiment. Accordingly, steps for fabricating a capacitor inside DRAM cell 203 can be avoided. Thus, DRAM cell 203 can be fabricated using a pure logic process. Moreover, as will be described below, RA transistor 3111 amplifies the read of a logic 1 from DRAM cell 203. Thus, transistor 3111 can operate as a built-in data sense amplifier for DRAM cell 203.

Writing a '0":

Referring still to FIG. 2, to write a logic 0 to cell 202, WBL 7153 is driven low to indicate a logic 0 on WBL 7153. WL 2151 is driven high to activate the gate of access transistor 2105, thereby allowing current to flow between the drain and the source of access transistor 2105. As such, whatever charges presented at the gate of RA transistor 2111 is allowed to discharge through access transistor 2105 and dissipate through WBL 7153 that has been driven low. Then, WL 2151 is driven low to deactivate access transistor 2110, thereby cutting off access to the gate of RA transistor 2111. As such, voltage at the gate of RA transistor 2111 remains low to represent a logic 0. Consequently, a logic 0 is stored at (written to) cell 202.

On the other hand, to write a logic 0 to cell 203, WBL 7153 is driven low to indicate a logic 0 on WBL 7153. WL 3151 is driven high to activate the gate of access transistor 3105, thereby allowing current to flow between the drain and the source of access transistor 3105. As such, whatever charges presented at the gate of RA transistor 3111 is allowed to discharge through access transistor 3105 and dissipate through WBL 7153 that has been driven low. Then, WL 3151 is driven low to deactivate access transistor 3110, thereby cutting off access to the gate of RA transistor 3111. As such, voltage at the gate of RA transistor 3111 remains low to represent a logic 0. Consequently, a logic 0 is stored at (written to) cell 203.

Writing a '1":

Referring still to FIG. 2, to write a logic 1 to cell 202, WBL 7153 is driven high to indicate a logic 1 on WBL 7153. WL 2151 is driven high to activate the gate of access transistor 2105, thereby allowing current to flow between the drain and the source of access transistor 2105. As such, the logic 1 on WBL 7153 is allowed to pass through access transistor 2105 and reach the gate of RA transistor 2111, thereby charging the gate of RA transistor 2111. Then, WL 2151 is driven low to deactivate access transistor 2110, thereby cutting off access to the gate of RA transistor 2111. As such, charges on the gate of RA transistor 2111 is prevented from discharging via access transistor 2110. And as such, charges are stored at (written to) the gate of RA transistor 2111 to represent the logic 1. Consequently, the logic 1 is stored at (written to) cell 202.

On the other hand, to write a logic 1 to cell 203, WBL 7153 is driven high to indicate a logic 1 on WBL 7153. WL 3151 is driven high to activate the gate of access transistor 3105, thereby allowing current to flow between the drain and the source of access transistor 3105. As such, the logic 1 on WBL 7153 is allowed to pass through access transistor 3105 and reach the gate of RA transistor 3111, thereby charging the gate of RA transistor 3111. Then, WL 3151 is driven low to deactivate access transistor 3110, thereby cutting off access to the gate of RA transistor 3111. As such, charges on the gate of RA transistor 3111 is prevented from discharging via access transistor 3110. And as such, charges are stored at (written to) the gate of RA transistor 3111 to represent the logic 1. Consequently, the logic 1 is stored at (written to) cell 203.

Refresh:

To refresh a logic 1 at DRAM cell 202, WBL 7153 is driven high to indicate a logic 1 on WBL 7153. WL 2151 is driven high to activate the gate of access transistor 2105, thereby allowing current to flow between the drain and the source of access transistor 2105. As such, the logic 1 is allowed to pass through access transistor 2105 and reach the gate of RA transistor 2111. As such, voltage at the gate of RA transistor 2111 is replenished . Then, WL 2151 is driven low to deactivate access transistor 2110, thereby cutting off access to the gate of RA transistor 2111. As such, charges at the gate of RA transistor 2111 are prevented from leaking out of access transistor 2110. Consequently, a logic 1 is refreshed at cell 202.

On the other hand, to refresh a logic 1 at DRAM cell 203, WBL 7153 is driven high to indicate a logic 1 on WBL 7153. WL 3151 is driven high to activate the gate of access transistor 3105, thereby allowing current to flow between the drain and the source of access transistor 3105. As such, the logic 1 is allowed to pass through access transistor 3105 and reach the gate of RA transistor 3111. As such, voltage at the gate of RA transistor 3111 is replenished . Then, WL 3151 is driven low to deactivate access transistor 3110, thereby cutting off access to the gate of RA transistor 3111. As such, charges at the gate of RA transistor 3111 are prevented from leaking out of access transistor 3110. Consequently, a logic 1 is refreshed at cell 203.

Reading a '0":

In DRAM cell 202, if a logic 0 is being stored at the gate of RA transistor 2111, the gate of RA transistor 2111 is deactivated, thereby preventing current from RCL 2171 to reach and charge RBL 7173. As such, the absence of a current on RBL 7173 keeps RBL 7173 low to indicate a logic 0. Consequently, a logic 0 is read out of DRAM cell 202 through RBL 7173.

In DRAM cell 203, if a logic 0 is being stored at the gate of RA transistor 111, the gate of RA transistor 3111 is deactivated, thereby preventing current from RCL 3171 to reach and charge RBL 7173. As such, the absence of a current on RBL 7173 keeps RBL 7173 low to indicate a logic 0. Consequently, a logic 0 is read out of DRAM cell 203 through RBL 7173.

As understood herein, in a conventional DRAM cell, reading a logic 0 involves redistribution of charge between a pre-charged bit line and a discharged capacitor, then sensing the amplified voltage differential of the bit line. The charge redistribution destroys the data (charge) maintained on the capacitor. As such, the read access to the conventional DRAM cell is a destructive read.

In contrast, because the logic 0 at the gate of RA transistor 2111 is maintained, reading a logic 0 from cell 202 is non-destructive. And, because the logic 0 at the gate of RA transistor 3111 is maintain, reading a logic 0 from cell 203 is also non-destructive. Specifically, because the present embodiment does not rely on charge distribution and sense amplification of voltage differential, the logic 0s being stored respectively at the gate of RA transistor 2111 and the gate of RA transistor 3111 are not destroyed by reading a logic 0. As such, in the present embodiment, reading a logic 0 (whether from cell 202 or cell 203) is non-destructive. Also, because the read does not depend on the destructive charge sharing voltage differential, the read speed (of a logic 0) allowed by both DRAM cells 202–203 is significantly higher than that of a conventional DRAM cell. Moreover, the present embodiment does not rely on charge redistribution that necessitates voltage differential sensing and sense amplification.

Reading a '1":

In cell 202, if a logic 1 is being stored at the gate of transistor 2111, the gate of transistor 2111 is activated, thereby allowing a current from RCL 2171 to reach and charge RBL 7173. Moreover, en route to RBL 7173, the current from RCL 2171 is amplified by RA (i.e., read-amplifying) transistor 2111. As such, this current drives RBL 7173 high to indicate a logic 1. Consequently, a logic 1 is read out of cell 202 through RBL 7173. Moreover, because the logic 1 being stored at the gate of RA transistor 2111 is maintained, reading a logic 1 is non-destructive. Also, when traveling through RA transistor 2111, the current is amplified by the current-amplifying property of RA transistor 2111 operating as a read amplifier for cell 202.

In cell 203, if a logic 1 is being stored at the gate of transistor 3111, the gate of transistor 3111 is activated, thereby allowing a current from RCL 3171 to reach and charge RBL 7173. Moreover, en route to RBL 7173, the current from RCL 3171 is amplified by RA transistor 3111. As such, this current drives RBL 7173 high to indicate a logic 1. Consequently, a logic 1 is read out of cell 203 through RBL 7173. Moreover, because the logic 1 being stored at the gate of RA transistor 3111 is maintained, reading a logic 1 is non-destructive. Also, when traveling through RA transistor 3111, the current is amplified by the current-amplifying property of RA transistor 3111 operating as a read amplifier for cell 203.

As understood herein, in a conventional DRAM cell, reading a. logic 1 involves redistribution of charge between a pre-charged bit line and a discharged capacitor, then sensing the amplified voltage differential of the bit line. The charge redistribution destroys the data (charge) maintained on the capacitor. As such, the read access to the conventional DRAM cell is a destructive read.

In contrast, because the logic 1 at the gate of RA transistor 2111 is maintained, reading a logic 1 is non-destructive. And, because the logic 1 at the gate of RA transistor 3111 is maintained, reading a logic 1 is also non-destructive. Specifically, because the present embodiment does not rely on charge distribution and sense amplification of voltage differential, the logic 1 s maintained at the gate of RA transistor 2111 and the gate of RA transistor 3111 are not destroyed by reading a logic 1. As such, in the present embodiment, reading a logic 1 (whether from cell 202 or cell 203) is non-destructive. Also, because the read does not depend on the destructive charge sharing voltage differential, the read speed (of a logic 1 ) allowed by DRAM cells 202–203 is significantly higher than that of a conventional DRAM cell.

Dual-Port Capability:

As shown in FIG. 2, DRAM 200 is a dual port DRAM because each of DRAM cells 202–203 has separate bit lines respectively as a writing/refresh port and a reading port. For example, cell 202 has WBL 7153 for a write/refresh port and RBL 7173 for a read port. Similarly, cell 203 also has WBL 7153 for a write/refresh port and RBL 7173 for a read port. As such, write can be performed simultaneously into any other DRAM cell using the same bit line such as WBL 7153. Refresh can be performed through WBL 7153 because the write/refresh port is independent of the read port. Effectively in the same clock cycle, a write or a refresh can be performed to cell 202 while a read can be performed from cell 203. Similarly, effectively in the same clock cycle, a write or a refresh can be performed to cell 203 while a read can be performed from cell 202. Moreover, unlike conventional dual-port DRAM, DRAM 200 can be fabricated in a very simple pure logic process.

Figure 3:
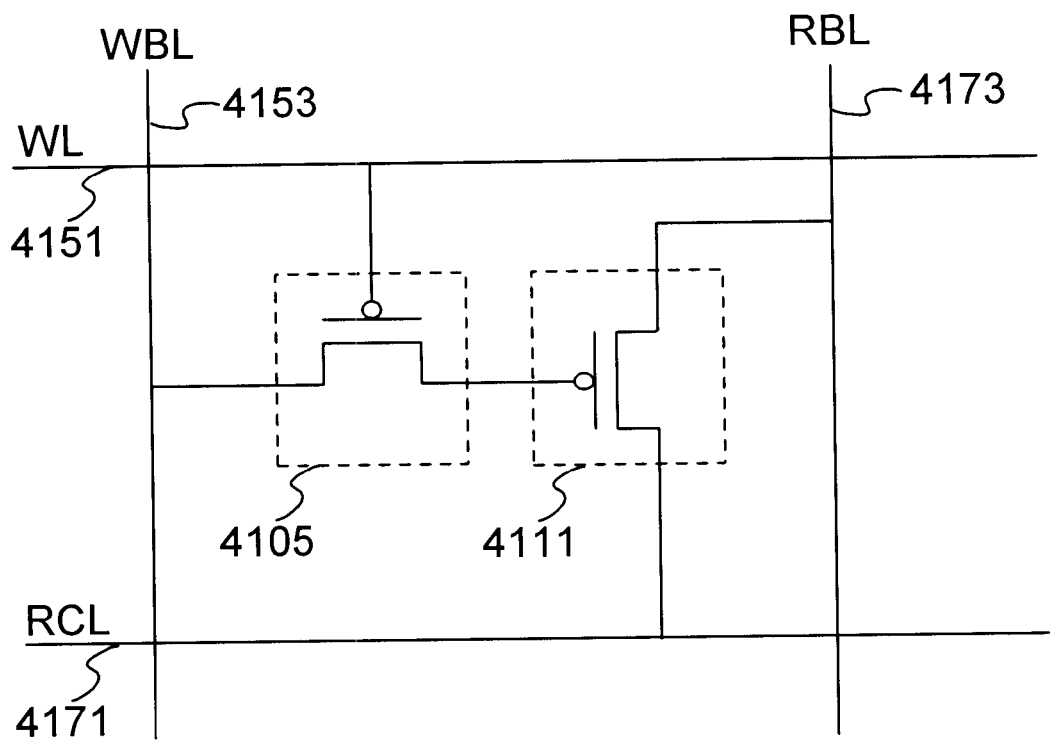
FIG. 3 shows a pMOS DRAM cell in accordance with one embodiment of the invention.

Referring now to FIG. 3, a DRAM cell 300 implementing pMOS transistors is shown in accordance with one embodiment of the invention. As shown, DRAM cell 300 comprises an access transistor 4105 implemented as pMOS, a RA transistor 4111 implemented as pMOS, a write line WL 4151, a WBL 4153, a RCL 4171, and a RBL 4173.

Referring now to FIG. 3, a DRAM cell 300 implementing pMOS transistors is shown in accordance with one embodiment of the invention. As shown, DRAM cell 300 comprises an access transistor 4105 implemented as pMOS, a RA transistor 4111 implemented as pMOS, a write line WL 4151, a WBL 4153, a RCL 4171, and a RBL 4173.

Access transistor 4105 is coupled to RA transistor 4111. Specifically, the drain of access transistor 4105 is coupled to the gate of RA transistor 4111. The gate of access transistor 4105 is coupled to WL 4151; the source of access transistor 4105 is coupled to WBL 4153. The source of RA transistor 111 is coupled to RCL 4171; the drain of RA transistor 4111 is coupled to RBL 4173.

Continuing with FIG. 3, RA transistor 4111 is adapted to store data such as a logic 1 (High) or a logic 0 (Low). Specifically, rather than using a capacitor to store the charge, the gate of RA transistor 4111 is used to store the charge. As such, in contrast to a conventional DRAM cell, no capacitor is used in the present embodiment. Accordingly, steps for fabricating a capacitor inside DRAM cell 300 can be avoided. Thus, DRAM cell 300 can be fabricated using a pure logic process. Moreover, as will be described below, RA transistor 4111 amplifies the read of a logic 1 from DRAM cell 300. Thus, transistor 4111 can operate as a built-in data sense amplifier for DRAM cell 300.

As understood herein, in other embodiments of the invention, a logic 1 can be used to represent High, and a logic 0 can be used to represent Low.

Writing a '1':

Referring still to FIG. 3, to write a logic 1 to DRAM cell 300, WBL 4153 is driven low (active low) to indicate a logic 1 on WBL 4153. WL 4151 is driven low to activate the gate of access transistor 4105, thereby allowing current to flow between the source and the drain of access transistor 4105. As such, whatever charges presented at the gate of RA transistor 4111 is allowed to discharge through access transistor 4105 and dissipate through WBL 4153 that has been driven low. Then, WL 4151 is driven high to deactivate access transistor 4110, thereby cutting off access to the gate of RA transistor 4111. As such, voltage at the gate of RA transistor 4111 remains low to represent a logic 1. Consequently, a logic 1 is stored at (written to) DRAM cell 300.

Writing a '0':

Referring still to FIG. 3, to write a logic 0 to DRAM cell 300, WBL 4153 is driven high to indicate a logic 0 on WBL 4153. WL 4151 is driven low to activate the gate of access transistor 4105, thereby allowing current to flow between the source and the drain of access transistor 4105. As such, the logic 0 on WBL 4153 is allowed to pass through access transistor 4105 and reach the gate of RA transistor 4111, thereby charging the gate of RA transistor 4111. Then, WL 4151 is driven high to deactivate access transistor 4110, thereby cutting off access to the gate of RA transistor 4111. As such, charges on the gate of RA transistor 4111 is prevented from discharging via access transistor 4110. And as such, charges are stored at (written to) the gate of RA transistor 4111 to represent the logic 0. Consequently, the logic 0 is stored at (written to) DRAM cell 300.

Refresh:

To refresh a logic 0 at DRAM cell 300, WBL 4153 is driven high to indicate a logic 0 on WBL 4153. WL 4151 is driven low to activate the gate of access transistor 4105, thereby allowing current to flow between the source and the drain of access transistor 4105. As such, the logic 0 is allowed to pass through access transistor 4105 and reach the gate of RA transistor 4111. As such, voltage at the gate of RA transistor 111 is replenished. Then, WL 4151 is driven high to deactivate access transistor 4110, thereby cutting off access to the gate of RA transistor 4111. As such, charges at the gate of RA transistor 4111 are prevented from leaking out of access transistor 4110. Consequently, a logic 0 is refreshed at DRAM cell 300.

Reading operations:

Continuing with FIG. 3, to read data stored at DRAM cell 300, RCL 4171 is driven high. The stored data is read out through RBL 4173, wherein the voltage level of RBL 4173 is used to indicate data stored in DRAM cell 300. In the present embodiment, a low on RBL 4173 indicates a logic 0 being stored at DRAM cell 300, while a high on RBL 4173 indicates a logic 1 being stored at DRAM cell 300.

As understood herein, polarity of write/refresh port and read port need not be fixed with the convention shown in the present embodiment. For example, in another embodiment, a different convention is used to indicate logic 1 and logic 0. Specifically, in this alternative embodiment, a low on WBL 4153 indicates a logic 0 while a high on WBL 4153 indicates a logic 1. Moreover, as such, a low on RBL 4173 indicates a logic 0 being stored at DRAM cell 300, while a high on RBL 4173 indicates a logic 1 being stored at DRAM cell 300.

Reading a '1':

Continuing with FIG. 3, if a logic 1 is being stored at the gate of transistor 4111, the gate of transistor 4111 is activated, thereby allowing a current from RCL 4171 to reach and charge RBL 4173. Moreover, en route to RBL 4173, the current from RCL 4171 is amplified by RA transistor 4111. As such, this current drives RBL 4173 high to indicate a logic 1. Consequently, a logic 1 is read out of DRAM cell 300 through RBL 4173.

As understood herein, in a conventional DRAM cell, reading a logic 1 involves redistribution of charge between a pre-charged bit line and a discharged capacitor, then sensing the amplified voltage differential of the bit line. The charge redistribution destroys the data (charge) maintained on the capacitor. As such, the read access to the conventional DRAM cell is a destructive read.

In contrast, because the logic 1 at the gate of RA transistor 4111 is maintained, reading a logic 1 is non-destructive. Specifically, because the present embodiment does not rely on charge distribution and sense amplification of voltage differential, the logic 1 being stored at the gate of RA transistor 4111 is not destroyed by reading a logic 1. As such, in the present embodiment, reading a logic 1 is non-destructive. Also, because the read does not depend on the destructive charge sharing voltage differential, the read speed allowed by DRAM cell 300 is significantly higher than that of a conventional DRAM cell. Moreover, the present embodiment does not rely on charge redistribution that necessitates voltage differential sensing and sense amplification. Furthermore, when traveling through RA transistor 111, the current is amplified by the current-amplifying property of RA transistor 4111 operating as a read amplifier for DRAM cell 300.

Reading a '0':

If a logic 0 is being stored at the gate of RA transistor 4111, the gate of RA transistor 4111 is deactivated, thereby preventing current from RCL 4171 to reach and charge RBL 4173. As such, the absence of a current on RBL 4173 keeps RBL 4173 low to indicate a logic 0. Consequently, a logic 0 is read out of DRAM cell 300 through RBL 4173.

As understood herein, in a conventional DRAM cell, reading a logic 0 involves redistribution of charge between a pre-charged bit line and a discharged capacitor, then sensing the amplified voltage differential of the bit line. The charge redistribution destroys the data (charge) maintained on the capacitor. As such, the read access to the conventional DRAM cell is a destructive read.

In contrast, because the logic 0 at the gate of RA transistor 4111 is maintained, reading a logic 0 is non-destructive. Specifically, because the present embodiment does not rely on charge distribution and sense amplification of voltage differential, the logic 0 at the gate of RA transistor 4111 is not destroyed by reading a logic 0. As such, in the present embodiment, reading a logic 0 is non-destructive. Also, because the read does not depend on the destructive charge sharing voltage differential, the read speed allowed by DRAM cell 300 is significantly higher than that of a conventional DRAM cell.

Dual-Port Capability:

As shown in FIG. 3, DRAM cell 300 is a dual port DRAM cell because DRAM cell 300 has separate bit lines (WBL 4153 and RBL 4173) respectively as a writing/refresh port and a reading port. As such, write can be performed simultaneously into any other DRAM cell using the same bit line such as WBL 4153. Refresh can be performed through WBL 4153 because the write/refresh port is independent of the read port. Effectively in the same clock cycle, a write or a refresh can be performed to cell 300 while a read can be performed from another DRAM cell. Similarly, effectively in the same clock cycle, a write or a refresh can be performed to another DRAM cell while a read can be performed from DRAM cell 300. Moreover, unlike conventional dual-port DRAM cells, DRAM cell 300 can be fabricated in a very simple pure logic process.

As understood herein, another embodiment of DRAM can be implemented with multiple cells, each of which having the pMOS design of cell 300 shown in FIG. 3. In this embodiment, the polarity of WLs, WBL, RBL are the reverse of WLs (2151 and 3151), WBL (7153) and RBL (7173) of the embodiment shown in FIG. 2.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A dynamic random access memory (DRAM) cell comprising:

an access transistor adapted to be activated by a word line (WL) coupled to said access transistor, said access transistor adapted to control data access to said DRAM cell;

a read-amplifying (RA) transistor having a gate whose charge level is adapted to represent a binary bit being stored by said DRAM cell, said gate coupled to said access transistor;

a write bit line (WBL) coupled to said access transistor, said WBL adapted to transfer a binary bit into said DRAM cell;

a read bit line (RBL) coupled to said RA transistor, said RBL adapted to transfer out of said DRAM cell a binary bit that indicates the charge level present on the gate of said RA transistor;

a read control line (RCL) coupled to said RA transistor, wherein in response to said RA being activated, said RCL is adapted to provide to said RBL a current that is amplified by said activated RA transistor.

2. The DRAM cell of claim 1, wherein said WBL is adapted to carry a binary bit with which to refreshed said DRAM cell.

3. The DRAM cell of claim 1, wherein for a read operation of said DRAM cell, said RBL is adapted to transfer out of said DRAM cell a binary bit while without destroying the charge level present on the gate of said RA transistor.

4. The DRAM cell of claim 1, wherein said access transistor and said RA transistor are nMOS transistors, wherein the gate of said RA transistor is coupled to the source of said access transistor; wherein said WBL is coupled to the drain of said access transistor; wherein said RBL is coupled to the source of said RA transistor; and wherein said RCL is coupled to the drain of said RA transistor.

5. The DRAM cell of claim 1, wherein said access transistor and said RA transistors are pMOS transistors, wherein the gate of said RA transistor is coupled to the drain of said access transistor; wherein said WBL is coupled to the source of said access transistor; wherein said RBL is coupled to the drain of said RA transistor; and wherein said RCL is coupled to the source of said RA transistor.

6. The DRAM cell of claim 1, wherein a pure logic process flow can be used to fabricate said DRAM cell.

7. A dynamic random access memory (DRAM) comprising:
a) a first DRAM cell comprising:
a first access transistor adapted to be activated by a first word line (WL) coupled to said first access transistor, said first access transistor adapted to control data access to said first DRAM cell;
a first read-amplifying (RA) transistor having a gate whose charge level is adapted to represent a binary bit being stored by said first DRAM cell, said gate coupled to said first access transistor;
a write bit line (WBL) coupled to said first access transistor, said WBL adapted to transfer a binary bit into said first DRAM cell;
a read bit line (RBL) coupled to said first RA transistor, said RBL adapted to transfer out of said first DRAM cell a binary bit that indicates the charge level present on the gate of said first RA transistor; and
a first read control line (RCL) coupled to said first RA transistor, wherein in response to said first RA transistor being activated, said first RCL is adapted to provide to said RBL a current that is amplified by said activated first RA transistor; and
b) a second DRAM cell comprising:
a second access transistor adapted to be activated by a second WL coupled to said second access transistor, said second access transistor adapted to control data access to said second DRAM cell;
a second RA transistor having a gate whose charge level is adapted to represent a binary bit being stored by said DRAM cell, said gate coupled to said access transistor;
said WBL coupled to said second access transistor, said WBL adapted to transfer a binary bit into said second DRAM cell;
said RBL coupled to said second RA transistor, said RBL adapted to transfer out of said second DRAM cell a binary bit that indicates the charge level present on the gate of said second RA transistor; and
a second RCL coupled to said second RA transistor, wherein in response to said second RA transistor being activated, said second RCL is adapted to provide to said RBL a current that is amplified by said activated second RA transistor.

8. The DRAM of claim 7, wherein said WBL is adapted to carry a binary bit with which to refresh said DRAM cell.

9. The DRAM of claim 7, wherein for a read operation of said first DRAM cell, said RBL is adapted to transfer out of said first DRAM cell a binary bit while without destroying the charge level present on the gate of said first RA transistor; and wherein for a read operation of said second DRAM cell, said RBL is adapted to transfer out of said second DRAM cell a binary bit while without destroying the charge level present on the gate of said second RA transistor.

10. The DRAM of claim 7, wherein said first access transistor and said first RA transistor are nMOS transistors, wherein the gate of said first RA transistor is coupled to the source of said first access transistor; wherein said WBL is coupled to the drain of said first access transistor; wherein said RBL is coupled to the source of said first RA transistor; and wherein said RCL is coupled to the drain of said first RA transistor; and wherein said second access transistor and said second RA transistor are nMOS transistors, wherein the gate of said second RA transistor is coupled to the source of said second access transistor; wherein said WBL is coupled to the drain of said second access transistor; wherein said RBL is coupled to the source of said second RA transistor; and wherein said second RCL is coupled to the drain of said second RA transistor.

11. The DRAM of claim 7, wherein said first access transistor and said first RA transistor are pMOS transistors, wherein the gate of said first RA transistor is coupled to the drain of said first access transistor; wherein said WBL is coupled to the source of said first access transistor; wherein said RBL is coupled to the drain of said first RA transistor; and wherein said RCL is coupled to the source of said first RA transistor; and wherein said second access transistor and said second RA transistor are pMOS transistors, wherein the gate of said second RA transistor is coupled to the drain of said second access transistor; wherein said WBL is coupled to the source of said second access transistor; wherein said RBL is coupled to the drain of said second RA transistor; and wherein said second d RCL is coupled to the source of said second RA transistor.

12. The DRAM of claim 7, wherein a write operation to said first DRAM cell and a read operation from said second DRAM cell can be performed effectively in a clock cycle, wherein a refresh operation to said first DRAM cell and a read operation from said second DRAM cell can be performed effectively in a clock cycle, wherein a read operation from said first DRAM cell and a write operation to said second DRAM cell can be performed effectively in a clock cycle, and wherein a read operation from said first DRAM cell and a refresh operation to said second DRAM cell can be performed effectively in a clock cycle.

13. The DRAM of claim 7, wherein a pure logic process flow can be used to fabricate said DRAM.

14. A dynamic random access memory (DRAM) cell comprising:
an access transistor adapted to control data access of said DRAM cell;
a read-amplifying (RA) transistor having its gate coupled to said access transistor, wherein the charge level on said gate is adapted to represent a binary bit being stored by said DRAM cell;
a word line (WL) coupled to the gate of said access transistor, said WL adapted to control the gate of said access transistor to control data access of said DRAM cell;
a word bit line (WBL) coupled to said access transistor, said WBL adapted to carry a binary bit to be written into said DRAM cell;
a read bit line (RBL) coupled to said RA transistor, said RBL adapted to carry a binary bit to be read from said DRAM cell, wherein said binary bit carried on said RBL indicates the charge level on the gate of said RA transistor; and
a read control line (RCL) coupled to said RA transistor, said RCL adapted to provide to said RBL a current that is controlled by the gate of said RA transistor.

15. The DRAM cell of claim 14, wherein said WBL is adapted to carry a binary bit with which to refresh said DRAM cell.

16. The DRAM cell of claim 14, wherein for a read operation of said DRAM cell, said RBL is adapted to transfer out of said DRAM cell a binary bit that indicates said binary bit represented by the charge level present on the gate of said RA transistor while without destroying the charge level present on the gate of said RA transistor.

17. The DRAM cell of claim 14, wherein said access transistor and said RA transistor are nMOS transistors, wherein the gate of said RA transistor is coupled to the source of said access transistor; wherein said WBL is coupled to the drain of said access transistor; wherein said RBL is coupled to the source of said RA transistor; and wherein said RCL is coupled to the drain of said RA transistor.

18. The DRAM cell of claim 14, wherein said access transistor and said RA transistors are pMOS transistors; wherein the gate of said RA transistor is coupled to the drain of said access transistor; wherein said WBL is coupled to the source of said access transistor; wherein said RBL is coupled to the drain of said RA transistor; and wherein said RCL is coupled to the source of said RA transistor.

19. The DRAM cell of claim 14, wherein said RA transistor amplifies said current from said RCL to said RBL.

20. A dynamic random access memory (DRAM) comprising:
  a) a first DRAM cell comprising:
    a first access transistor adapted to control data access of said DRAM cell;
    a first read-amplifying (RA) transistor having its gate coupled to said first access transistor, wherein the charge level on said gate of said first RA transistor is adapted to represent a binary bit being stored by said second DRAM cell;
    a first word line (WL) coupled to the gate of said first access transistor, said first WL adapted to control the gate of said first access transistor to control data access of said first DRAM cell;
    a write bit line (WBL) coupled to said first access transistor, said WBL adapted to carry a binary bit to be written into said first DRAM cell;
    a read bit line (RBL) coupled to said first RA transistor, said RBL adapted to carry a binary bit to be read from said first DRAM cell, wherein said binary bit carried on said RBL indicates the charge level on the gate of said first RA transistor; and
    a first read control line (RCL) coupled to said RA transistor, said first RCL adapted to provide to said RBL a first current that is controlled by the gate of said first RA transistor; and
  b) a second DRAM cell comprising:
    a second access transistor adapted to control data access of said second DRAM cell;
    a second RA transistor having its gate coupled to said second access transistor, wherein the charge level on said gate of said RA transistor is adapted to represent a binary bit being stored by said second DRAM cell;
    a second WL coupled to the gate of said second access transistor, said second WL adapted to control the gate of said second access transistor to control data access of said second DRAM cell;
    said WBL coupled to said second access transistor, said WBL adapted to carry a binary bit to be written into said second DRAM cell;
    said RBL coupled to said second RA transistor, said RBL adapted to carry a binary bit to be read from said second DRAM cell, wherein said binary bit carried on said RBL indicates the charge level on the gate of said second RA transistor; and
    a second RCL coupled to said second RA transistor, said second RCL adapted to provide to said RBL a second current that is controlled by the gate of said second RA transistor.

21. The DRAM of claim 20, wherein said WBL is adapted to carry a binary bit to be refreshed into said DRAM cell.

22. The DRAM of claim 20, wherein for a read operation of said first DRAM cell, said RBL is adapted to transfer out of said first DRAM cell a binary bit while without destroying the charge level present on the gate of said first RA transistor; and wherein for a read operation of said second DRAM cell, said RBL is adapted to transfer out of said second DRAM cell a binary bit while without destroying the charge level present on the gate of said second RA transistor.

23. The DRAM of claim 20, wherein said first access transistor and said first RA transistors are nMOS transistors; wherein the gate of said first RA is coupled to the source of said first access transistor; wherein said WBL is coupled to the drain of said first access transistor; wherein said RBL is coupled to the source of said first RA transistor; and wherein said first RCL is coupled to the drain of said first RA transistor; and
  wherein said second access transistor and said second RA transistors are nMOS transistors; wherein the gate of said second RA is coupled to the source of said second access transistor; wherein said WBL is coupled to the drain of said second access transistor; wherein said RBL is coupled to the source of said second RA transistor; and wherein said second RCL is coupled to the drain of said second RA transistor.

24. The DRAM of claim 20, wherein said first access transistor and said first RA transistors are pMOS transistors; wherein the gate of said first RA is coupled to the drain of said first access transistor; wherein said WBL is coupled to the source of said first access transistor, wherein said RBL is coupled to the drain of said first RA transistor; and wherein said first RCL is coupled to the source of said first RA transistor; and
  wherein said second access transistor and said second RA transistors are pMOS transistors; wherein the gate of said second RA is coupled to the drain of said second access transistor; wherein said WBL is coupled to the source of said second access transistor; wherein said RBL is coupled to the drain of said second RA transistor; and wherein said second RCL is coupled to the source of said second RA transistor.

25. The DRAM of claim 20, wherein said first RA transistor is adapted to amplify said first current from said first RCL to said RBL, and wherein said second RA transistor is adapted to amplify said second current from said second RCL to said RBL.

26. The DRAM of claim 20, wherein a write operation to said first DRAM cell and a read operation from said second DRAM cell can be performed effectively in a clock cycle, wherein a refresh operation to said first DRAM cell and a read operation from said second DRAM cell can be performed effectively in a clock cycle, wherein a read operation from said first DRAM cell and a write operation to said second DRAM cell can be performed effectively in a clock cycle, and wherein a read operation from said first DRAM cell and a refresh operation to said second DRAM cell can be performed effectively in a clock cycle.

* * * * *